United States Patent
Kayes et al.

(10) Patent No.: US 8,530,338 B2
(45) Date of Patent: Sep. 10, 2013

(54) STRUCTURES OF AND METHODS FOR FORMING VERTICALLY ALIGNED SI WIRE ARRAYS

(75) Inventors: Brendan M. Kayes, Los Angeles, CA (US); Michael A. Filler, Pasadena, CA (US); Nathan S. Lewis, La Canada, CA (US); Harry A. Atwater, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 1453 days.

(21) Appl. No.: 12/176,099

(22) Filed: Jul. 18, 2008

(65) Prior Publication Data
US 2009/0020853 A1    Jan. 22, 2009

Related U.S. Application Data (60) Provisional application No. 60/961,170, filed on Jul. 19, 2007, provisional application No. 60/961,169, filed on Jul. 19, 2007.

(51) Int. Cl.
*H01L 29/72* (2006.01)

(52) U.S. Cl.
USPC ........ 438/478; 117/94; 257/618; 257/E21.09; 257/E29.005

(58) Field of Classification Search
USPC ............... 438/478; 117/94; 257/618, E21.09, 257/E29.005
See application file for complete search history.

(56) References Cited

U.S. PATENT DOCUMENTS

| | | | |
|---|---|---|---|
| 5,314,569 A | 5/1994 | Pribat | |
| 5,352,651 A | 10/1994 | Debe | |
| 5,976,957 A | 11/1999 | Westwater et al. | |
| 6,306,734 B1 | 10/2001 | Givargizov | |
| 6,649,824 B1 | 11/2003 | Den | |
| 7,105,428 B2 | 9/2006 | Pan et al. | |
| 7,253,442 B2 | 8/2007 | Huang | |
| 7,309,620 B2 | 12/2007 | Fonash et al. | |
| 2002/0172820 A1 | 11/2002 | Majumdar et al. | |
| 2004/0213307 A1* | 10/2004 | Lieber et al. | 372/39 |
| 2006/0118791 A1 | 6/2006 | Leu | |
| 2007/0122313 A1 | 5/2007 | Li et al. | |

(Continued)

FOREIGN PATENT DOCUMENTS

| | | |
|---|---|---|
| JP | 11-214720 | 8/1999 |
| JP | 2005-194609 | 7/2005 |

(Continued)

OTHER PUBLICATIONS

Office Action issued by USPTO for U.S. Appl. No. 12/176,100 dated Jan. 6, 2010.

(Continued)

*Primary Examiner* — Edward Wojciechowicz
(74) *Attorney, Agent, or Firm* — Joseph R. Baker, Jr.; Gavrilovich, Dodd & Lindsey LLP (57) ABSTRACT

A structure consisting of vertically aligned wire arrays on a Si substrate and a method for producing such wire arrays. The wire arrays are fabricated and positioned on a substrate with an orientation and density particularly adapted for conversion of received light to energy. A patterned oxide layer is used to provide for wire arrays that exhibit narrow diameter and length distribution and provide for controlled wire position.

14 Claims, 6 Drawing Sheets

U.S. PATENT DOCUMENTS

2007/0232028 A1* 10/2007 Lee et al. ............... 438/478
2008/0075954 A1   3/2008 Wardle et al.
2008/0315430 A1  12/2008 Weber et al.

FOREIGN PATENT DOCUMENTS

JP    2005-310388   11/2005
KR    10-2007-18457  2/2007
WO    2006/138671   12/2006

OTHER PUBLICATIONS

Sze, S. M. *Physics of Semiconductor Devices*, 2 ed.; John Wiley & Sons, New York, 1981.
Kayes, B. M.; Atwater, H. A.; Lewis, N. S. *J. Appl. Phys.* 2005, 97, 114302.
Fan, H. J.; Werner, P.; Zacharias, M. *Small* 2006, 2, 700-717.
Lombardi, I.; Hochbaum, A. I.; Yang, P.; Carraro, C.; Maboudian, R. *Chem. Mater.* 2006, 18, 988-991.
Huang, Z. P.; Fang, H.; Zhu, J. *AdV. Mater.* 2007, 19, 744-748.
Peng, K.; Xu, Y.; Wu, Y.; Yan, Y.; Lee, S.-T.; Zhu, J. *Small* 2005, 1,1062-1067.
Huynh, W. U.; Dittmer, J. J.; Alivisatos, A. P. *Science* 2002, 295, 2425-2427.
Lin, Y. T.; Zeng, T. W.; Lai, W. Z.; Chen, C. W.; Lin, Y. Y.; Chang, Y.S.; Su, W. F. *Nanotechnology* 2006, 17, 5781-5785.
Law, M.; Greene, L. E.; Johnson, J. C.; Saykally, R.; Yang, P. D. *Nat. Mater.* 2005, 4, 455-459.
Wagner, R. S.; Ellis, W. C. *Trans. Metallurg. Soc. AIME* 1965, 233, 1053.
Kayes, B. M.; Filler, M. A.; Putnam, M. C.; Kelzenberg, M. D.; Lewis, N. S.; Atwater, H. A. *Appl. Phys. Lett.* 2007, 91, 103110.
Westwater, J.; Gosain, D. P.; Usui, S. *Jpn. J. Appl. Phys. Part 1* 1997, 36, 6204-6209.
Woodruff, J. H.; Ratchford, J. B.; Goldthorpe, I. A.; McIntyre, P. C.; Chidsey, C. E. D. *Nano Lett.* 2007, 7, 1637-1642.
Struthers, J. D. *J. Appl. Phys.* 1956, 27, 1560-1560.
Gibbons, J. F.; Cogan, G. W.; Gronet, C. M.; Lewis, N. S. *Appl. Phys. Lett.* 1984, 45, 1095-1097.
Gronet, C. M.; Lewis, N. S.; Cogan, G. W.; Gibbons, J. F. *Proc. Natl. Acad. Sci. U.S.A.* 1983, 80, 1152-1156.
Rosenbluth, M. L.; Lewis, N. S. *J. Am. Chem. Soc.* 1986, 108, 4689-4695.
Rosenbluth, M. L.; Lewis, N. S. *J. Phys. Chem.* 1989, 93, 3735-3740.
Rosenbluth, M. L.; Lieber, C. M.; Lewis, N. S. *Appl. Phys. Lett.* 1984, 45, 423-425.
Gstrein, F.; Michalak, D. J.; Royea, W. J.; Lewis, N. S. *J. Phys. Chem. B* 2002, 106, 2950-2961.
James R. Maiolo III, Brendan M. Kayes, Michael A. Filler, Morgan C. Putnam, Michael D. Kelzenberg, Harry A. Atwater, and Nathan S. Lewis, J. Am. Chem. Soc. 2007, 129, 12346-12347.
Kayes, B. M.; Richardson, C. E.; Lewis, N. S.; Atwater, H. A. *IEEE Photo. Spec. Conf.* 2005, 55-58.
McCandless, B., and Sites, J. Cadmium Telluride Solar Cells. In *Handbook of Photovoltaic Science and Engineering*, 2003; pp. 617-657.
Jenny, D.; Bube, R. *Phys. Rev.* 1954, 96, 1190-1191.
Harris, L. A.; Wilson, R. H. *Adv. Rev. Mater. Sci.* 1978, 8, 99-134.
Basol, B. *J. Appl. Phys.* 1984, 55, 601-603.
Fulop, G., et al. *Appl. Phys. Lett.* 1982, 40, 327-328.
Bhattacharya, R.; Rajeshwar, K. *J. Electrochem. Soc.* 1984, 131, 2032-2041.
Paulson, P. D.; Mathew, X. *Sol. Energy Mater. Sol. Cells* 2004, 82, 279-290.
Lepiller, C.; Lincot, D. *J. Electrochem. Soc.* 2004, 151, C348-C357.
Kressin, A.; Doan, V.; Klein, J.; Sailor, M. *Chem. Mater.* 1991, 3, 1015-1020.
Basol, B. *Conf. Rec. IEEE Photo. Spec. Conf.* 1990, 588-594.
Klein, J.; Herrick, R.; Palmer, D.; Sailor, M.; Brumlik, C.; Martin, C. *Chem. Mater.* 1993, 5, 902-904.
Basol, B.; Tseng, E.; Rod, R. *Conf. Rec. IEEE Photo. Spec. Conf.* 1982, 805-808.
Xia, Y., et al. *Adv. Mater.* 2003, 15, 353-389.
Law, M.; Goldberger, J.; Yang, P. *Annu. Rev. Mater. Res.* 2004, 34, 83-122.
Gu, Y.; Romankiewicz, J.; David, J.; Lensch, J.; Lauhon, L. *Nano Lett.* 2006, 6, 948-952.
Yu, J.; Chung, S.; Heath, J. *J. Phys. Chem. B* 2000, 104, 11864-11870.
Haick, H.; Hurley, P.; Hochbaum, A.; Yang, P.; Lewis, N. *J. Am. Chem. Soc.* 2006, 128, 8990-8991.
Lauhon, L.; Gudiksen, M.; Wang, D.; Lieber, C. *Nature* 2002, 420, 57-61.
Shimizu, T.; Xie, T.; Nishikawa, J.; Shingubara, S.; Senz, S.; Gosele, U. *Adv. Mater.* 2007, 19, 917-920.
Erts, D., et al. *J. Phys. Chem. B* 2006, 110, 820-826.
Mohan, P.; Motohisa, J.; Fukui, T. *Nanotech.* 2005, 16, 2903-2907.
Fan, H., et al. *J. Cryst. Growth* 2006, 287, 34-38.
Routkevitch, D.; Bigioni, T.; Moskovits, M.; Xu, J. M. *J. Phys. Chem.* 1996, 100, 14037-14047.
Yoonmook, K.; Park, N.; Kim, D. *Appl. Phys. Lett.* 2005, 86, 113101-1 to 113101-3.
James R. Maiolo, III, Harry A. Atwater, and Nathan S. Lewis, J. Phys. Chem. 112, 6194-6201, 2008.
Z. Huang, H. Feng, and J. Zhu, Adv. Mater. (Weinheim, Ger.) 19, 744 (2007).
R. S. Wagner and W. C. Ellis, Appl. Phys. Lett. 4, 89 (1964).
T. Martensson, M. Borgstrom, W. Seifert, B. J. Ohlsson, and L. Samuelson, Nanotechnology 14, 1255 (2003).
J. Westwater, D. P. Gosain, and S. Usui, Jpn. J. Appl. Phys., Part 1 36, 6204 (1997).
T. Kawano, Y. Kato, M. Futagawa, H. Takao, K. Sawada, and M. Ishida, Sens. Actuators, A 97, 709 (2002).
B. M. Kayes, J. M. Spurgeon, T. C. Sadler, N. S. Lewis, and H. A. Atwater, Proceedings of the Fourth IEEE WCPEC, 2006, vol. 1, p. 221.
T. Shimizu, T. Xie, J. Nishikawa, S. Shingybara, S. Senz, and U. Gosele, Adv. Mater. (Weinheim, Ger.) 19, 917 (2007).
B. M. Kayes, N. S. Lewis, and H. A. Atwater, J. Appl. Phys. 97, 114302 2005.
M. J. A. de Dood, Ph.D. thesis, Utrecht University, 2002.
H. J. Fan, P. Werner, and M. Zacharias, Small 2, 700, 2006.
E. I. Givargizov, *Highly Anisotropic crystals* _D. Reidel, Dordrecht, Holland,1987, p. 169.
J. Westwater, D. P. Gosain, and S. Usui, Jpn. J. Appl. Phys., Part 1 36, 6204, 1997.
A. I. Hochbaum, R. Fan, R. He, and P. Yang, Nano Lett. 5, 457, 2005.
I. Lombardi, A. I. Hochbaum, P. Yang, C. Carraro, and R. Maboudian, Chem. Mater. 18, 988, 2006.
V. Schmidt, S. Senz, and U. Gösele, Nano Lett. 5, 931, 2005.
W. M. Bullis, Solid-State Electron. 9, 143, 1966.
C. Jacoboni, C. Canali, G. Ottaviani, and A. Alberigi Quaranta, Solid-State Electron. 20, 77, 1977.
L. J. Guo, Adv. Mater. Weinheim, Ger. 19, 495, 2007.
Y. Yao and S. Fan, Mater. Lett. 61, 177, 2007.
R. S. Wagner and W. C. Ellis, Trans. Metall. Soc. AIME 233, 1053, 1965.
G. B. Haxel, J. B. Hedrick, and G. J. Orris, *Rare Earth Elements—critical Resources for High Technology: US Geological Survey Fact Sheet 087-02*, 2002, p. 3.
D. Struthers, J. Appl. Phys. 27, 1560, 1956.
M. Sze, *Physics of Semiconductor Devices*, 2nd ed. _Wiley, New York, 1981, p. 21.
J. R. Davis, A. Rohatgi, R. H. Hopkins, P. D. Blais, P. Raichoudhury, J. R. McCormick, and H. C. Mollenkopf, IEEE Trans. Electron Devices 27, 677, 1980.
R. H. Hopkins and A. Rohatgi, J. Cryst. Growth 75, 67, 1986.
B.M. Kayes, C.E. Richardson, N.S. Lewis, and H.A. Atwater, IEEE PVSC 2005.
Schetinin, Drozhzhin, Sedykh, Novokreshchenova—Photoconverters Based on Si Whiskers 1978.
Brendan M. Kayes, Michael A. Filler, Morgan C. Putnam, Michael D. Kelzenberg, Nathan S. Lewis, and Harry A. Atwater, Applied Physics Letters 91, 103110 (2007).
Supplementary material for Brendan M. Kayes, Michael A. Filler, Morgan C. Putnam, Michael D. Kelzenberg, Nathan S. Lewis, and Harry A. Atwater, "Growth of vertically aligned Si wire arrays over large areas (>1 cm2) with Au and Cu catalysts", App. Phys. Lett.

Michael D. Kelzenberg, Daniel B. Turner-Evans, Brendan M. Kayes, Michael A. Filler, Morgan C. Putnam, Nathan S. Lewis, and Harry A. Atwater, Nono Letters, vol. 8, No. 2, 710-714, 2008.

B. M. Kayes, H. A. Atwater, and N. S. Lewis, *J. Appl. Phys.* 97 (11), 114302 (2005).

B. M. Kayes, M. A. Filler, M. C. Putnam et al., *Appl. Phys. Lett.* 91, 103110 (2007).

J. R. Maiolo, B. M. Kayes, M. A. Filler et al., *J. Am. Chem. Soc.* 129, 12346 (2007).

M. D. Kelzenberg, D. B. Turner-Evans, B. M. Kayes et al., *Nano. Lett.* 8 (2), 710 (2008).

L. Tsakalakos, J. Balch, J. Fronheiser et al., *Appl. Phys. Lett.* 91 (23) (2007).

V. L. Pushparaj, M. M. Shaijumon, A. Kumar et al., *Proc. Natl. Acad. Sci. U. S. A.* 104 (34), 13574 (2007).

E. Sunden, J. K. Moon, C. P. Wong et al., *J. Vac. Sci. Technol. B* 24 (4), 1947 (2006).

Y. J. Jung, S. Kar, S. Talapatra et al., *Nano. Lett.* 6 (3), 413 (2006).

N. R. Raravikar, A. S. Vijayaraghavan, P. Keblinski et al., *Small* 1 (3), 317 (2005).

E. B. Sansom, D. Rinderknecht, and M. Gharib, *Nanotechnology* 19, 035302 (2008).

D. Meissner, R. Memming, and B. Kastening, *Chem. Phys. Lett.* 96 (1), 34 (1983).

M. P. Zach, K. Inazu, K. H. Ng et al., *Chem. Mater.* 14 (7), 3206 (2002).

S. A. Morin, F. F. Amos, and S. Jin, *J. Am. Chem. Soc.* 129 (45), 13776 (2007).

D. H. Kim, J. H. Ahn, W. M. Choi et al., *Science* 320 (5875), 507 (2008).

H. J. Fan, P. Werner, and M. Zacharias, *Small* 2 (6), 700 (2006).

Y. N. Xia, P. D. Yang, Y. G. Sun et al., *Adv. Mater.* 15 (5), 353 (2003).

R. S. Wagner and W. C. Ellis, *Trans. Metal. Soc. AIME* 233 (6), 1053-1064 (1965).

I. Lombardi, A. I. Hochbaum, P. D. Yang et al., *Chem. Mater.* 18 (4), 988-991 (2006).

J. N. Lee, C. Park, and G. M. Whitesides, *Anal. Chem.* 75 (23), 6544 (2003).

J. C. McDonald and G. M. Whitesides, *Acc. Chem. Res.* 35 (7), 491 (2002).

Z. P. Yang, L. J. Ci, J. A. Bur et al., *Nano. Lett.* 8 (2), 446 (2008).

L. Tsakalakos, J. Balch, J. Fronheiser et al., *J. Nanophotonics* 1, 013552 (2007).

G. H. Yu, A. Y. Cao, and C. M. Lieber, *Nat. Nanotechnol.* 2 (6), 372 (2007).

K. Q. Peng, Z. P. Huang, and J. Zhu, Adv. Mater. 16 (1), 73-76 (2004).

V. Gowrishankar, N. Miller, M. D. McGehee, M. J. Misner, D. Y. Ryu, T. P. Russell, E. Drockenmuller, and C. J. Hawker, Thin Solid Films 513, 289-294 (2006).

Y. Y. Wu, H. Q. Yan, and P. D. Yang, Top. Catal. 19 (2), 197-202 (2002).

T. Bogart, S. Dey, K. K. Lew, S. Mohney, and J. Redwing, Adv. Mater. 17 (1), 114-117 (2005).

B. M. Kayes, J. M. Spurgeon, T. C. Sadler, N. S. Lewis, and H. A. Atwater, Proc. $4^{th}$ IEEE WCPEC 1, 221-224 (2006).

R. S. Wagner and W. C. Ellis, Appl. Phys. Lett. 4 (5), 89-90 (1964).

A. M. Morales and C. M. Lieber, Science 279 (5348), 208-211 (1998).

A. I. Hochbaum, R. Fan, R. R. He, and P. D. Yang, Nano Lett. 5 (3), 457-460 (2005).

A. P. Goodey, S. M. Eichfeld, K. K. Lew, J. M. Redwing, and T. E. Mallouk, J. Am.Chem. Soc. 129 (41), 12344-12345 (2007).

X. P. Wu, Q. H. Wu, and W. H. Ko, Sens. Actuators 9 (4), 333-343 (1986).

H. Ismail and U. Hashim, Proc. IEEE ICSE, 53-56 (2002).

T. L. Chu, E. D. Stokes, and R. A. Abderrassoul, Proc. IEEE Southeastcon, 1436-1441 (1989).

PCT Search Report for PCT/US2008/070495 in the name of California Institute of Technology filed on Jul. 18, 2008.

PCT Written Opinion for PCT/US2008/070495 in the name of California Institute of Technology filed on Jul. 18, 2008.

PCT Search Report for PCT/US2008/070523 in the name of California Institute of Technology filed on Jul. 18, 2008.

PCT Written Opinion for PCT/US2008/070523 in the name of California Institute of Technology filed on Jul. 18, 2008.

PCT Search Report for PCT/US2008/070509 in the name of California Institute of Technology filed on Jul. 18, 2008.

PCT Written Opinion for PCT/US2008/070509 in the name of California Institute of Technology filed on Jul. 18, 2008.

PCT Search Report for PCT/US2008/070518 in the name of California Institute of Technology filed on Jul. 18, 2008.

PCT Written Opinion for PCT/US2008/070518 in the name of California Institute of Technology filed on Jul. 18, 2008.

\* cited by examiner

STRUCTURES OF AND METHODS FOR FORMING VERTICALLY ALIGNED SI WIRE ARRAYS

CROSS-REFERENCE TO RELATED APPLICATIONS

The present application is related to and claims the benefit of copending and commonly assigned U.S. Patent Application No. 60/961,170, titled "Fabrication of Wire Array Samples and Controls," filed on Jul. 19, 2007, the entire contents of which are incorporated herein by reference, and is related to and claims the benefit of copending and commonly assigned U.S. Patent Application No. 60/961,169, titled "Growth of Vertically Aligned Si Wire Arrays Over Large Areas (>1 cm$^2$) with Au and Cu Catalysts," filed on Jul. 19, 2007, the entire contents of which are incorporated herein by reference.

STATEMENT REGARDING FEDERALLY SPONSORED RESEARCH OR DEVELOPMENT

The U.S. Government has certain rights in this invention pursuant to Grant No. DE-FG02-03ER15483 awarded by DOE.

BACKGROUND

1. Field

This disclosure relates to Si wire arrays. More specifically, the present disclosure describes structures of vertically oriented Si wire arrays and methods for forming such arrays.

2. Description of Related Art

Well-defined wire arrays have been produced using lithographic patterning followed by anisotropic etching, but such methods typically require large areas of high-quality substrate materials. See, for example, Z. Huang, H. Feng, and J. Zhu, Adv. Mater. (Weinheim, Ger.) 19, 744 (2007).

Wires of various materials have also been grown 'bottom up' by the vapor-liquid-solid (VLS) process. See, for example, R. S. Wagner and W. C. Ellis, Appl. Phys. Lett. 4, 89 (1964). Control of the size and position of VLS-grown wires has been demonstrated, particularly in the case of Si, by patterning of a surface oxide. See, for example, E. I. Givargizov, Highly Anisotropic crystals (D. Reidel, Dordrecht, Holland, 1987), p. 169; T. Martensson, M. Borgstrom, W. Seifert, B. J. Ohlsson, and L. Samuelson, Nanotechnology 14, 1255 (2003); J. Westwater, D. P. Gosain, and S. Usui, Jpn. J. Appl. Phys., Part 1 36, 6204 (1997); T. Kawano, Y. Kato, M. Futagawa, H. Takao, K. Sawada, and M. Ishida, Sens. Actuators, A 97, 709 (2002); B. M. Kayes, J. M. Spurgeon, T. C. Sadler, N. S. Lewis, and H. A. Atwater, Proceedings of the Fourth IEEE WCPEC, 2006, Vol. 1, p. 221. Wire array growth, typically, has only been achieved over relatively small areas, unless a template is used. See, for example, T. Shimizu, T. Zie, J. Nishikawa, S. Shingybara, S. Senz, and U. Gosele, Adv. Mater. (Weinheim, Ger.) 19, 917 (2007). Wire array growth by some methods may result in a random distribution of wires on a substrate and/or where the wires have random orientations with respect to each other. Such wire arrays may have an appearance that may be characterized as similar to felt or felt-like.

SUMMARY

Embodiments of the present invention comprise relatively dense arrays of Si wires with dimensions particularly adapted for reception and conversion of light to energy. Preferred embodiments are arrays of crystalline Si wires of a length long enough to absorb sunlight fully, where the wires have radii matched to their diffusion length, and are regularly spaced and oriented predominantly vertically. Embodiments of the present invention also provide that such arrays may be fabricated preferably over large areas.

According to embodiments of the present invention, vertically aligned wire arrays may be formed by patterning a templating layer with an array of holes on a substrate. The templating layer serves as a diffusion barrier for a growth catalyst and provides a template for structures to be grown. A growth catalyst, such as gold, copper or nickel, is deposited into the holes. Growth of wires on the substrate is accomplished by heating the substrate and applying a growth gas, such as SiCl$_4$. Wires will grow from the substrate under the catalyst that is deposited in the holes. Use of a templating layer, such as a patterned oxide layer, produces nearly defect-free arrays that exhibit an extremely narrow diameter and length distribution, and highly controlled wire position.

One embodiment of the present invention is a structure comprising: an ordered array of crystalline Si wires, where the Si wires in a plurality of the crystalline Si wires have diameter dimensions generally orthogonal to length dimensions and where radii of the plurality of Si wires in the diameter dimension are roughly equal to the minority carrier diffusion length of the material comprising the Si wires. Preferably, the Si wires are oriented in a direction for the reception of light energy and have spacings that are optimal for the reception of light energy.

Another embodiment of the present invention is a method for fabricating vertically aligned Si wire arrays, where the method comprises: forming a templating layer on a Si substrate; patterning the templating layer with a plurality of holes extending to the Si substrate; depositing a catalyst into one or more of the holes in the oxide layer; and growing wires on the substrate at a temperature between 850° C. to 1100° C. and applying a growth gas comprising SiCl$_4$.

Still another embodiment is a method for fabricating semiconductor structures, where the method comprises: forming a templating layer on a Si substrate; patterning the templating layer with an array of holes extending to the Si substrate; forming catalyst islands within one or more holes in the array of holes; and growing semiconductor structures on the Si substrate at a temperature between about 950° C. to about 1050° C. and applying a growth gas comprising SiCl$_4$.

Still another embodiment of the present invention is a method for fabricating vertically aligned wire arrays for solar energy conversion, where the method comprises: forming a templating layer on a Si substrate; patterning the templating layer with a plurality of holes extending to the substrate; depositing a catalyst into one or more of the holes in the templating layer; growing wires on the substrate at a temperature between 850° C. to 1100° C. and applying a growth gas comprising SiCl$_4$, where a plurality of the grown wires have aspect ratios providing optimal or near optimal conversion of solar energy to electricity.

DETAILED DESCRIPTION

Within this description, the terms "wires," "rods," "whiskers," and "pillars" and other similar terms may be used synonymously, except as otherwise indicated. Generally, these terms refer to elongate structures which have lengths and widths, where the length is defined by the longest axis of the structure and the width is defined by the axis generally normal to the longest axis of the structure. The term 'aspect ratio' refers to the ratio of a structure's length to its width. Hence, the aspect ratios of the elongate structures will greater than one. The terms "ball," "spheroid," "blob" and other similar terms may also be used synonymously, except as otherwise indicated. Generally, these terms refer to structures with the width defined by the longest axis of the structure and the length defined by the axis generally normal to the width. Hence, the aspect ratio of such structures will generally be unity or less than unity. Further the term "vertical" with reference to wires, rods, whiskers, pillars, etc., generally refers to structures that have a length direction that is elevated somewhat from horizontal. The term "vertical alignment" generally refers to an alignment or orientation of a structure or structures that is elevated from horizontal. The structure or structures do not have to be completely normal to horizontal to be considered to have a vertical alignment. The term "array" generally refers to multiple numbers of structures distributed within an area and spaced apart, unless otherwise indicated. Structures within an array all do not have to have the same orientation. The terms "vertically aligned array" or "vertically oriented array" generally refer to arrays of structures where the structures have orientations elevated from a horizontal orientation up to orientations completely normal to a horizontal orientation, but the structures within the array may or may not have all the same orientations with respect to horizontal. The terms "ordered" or "well-defined" generally refer to the placement of elements in a specified or predetermined pattern where the elements have distinct spatial relationships to one another. Hence, the terms "ordered array" or "well-defined" generally refer to structures distributed within an area with distinct, specified or predetermined spatial relationships to one another. For example, the spatial relationships within an ordered array may be such that the structures are spaced apart from one another by generally equal distances. Other ordered arrays may use varying, but specified or predetermined, spacings. The structures within "ordered" or "well-defined" arrays may also have similar orientations with respect to each other.

Within this description, the term "semiconductor" is generally used to refer to elements, structures, or devices, etc. comprising materials that have semiconductive properties, unless otherwise indicated. Such materials include, but are not limited to: elements from Group IV of the periodic table: materials including elements from Group IV of the period table; materials including elements from Group III and Group V of the periodic table; materials including elements from Group II and Group VI of the periodic table; materials including elements from Group I and Group VII of the periodic table; materials including elements from Group IV and Group VI of the periodic table; materials including elements from Group V and Group VI of the periodic table; and materials including elements from Group II and Group V of the periodic table. Other materials with semiconductive properties may include: layered semiconductors; metallic alloys; miscellaneous oxides; some organic materials, and some magnetic materials. The term "semiconductor structure" refers to a structure consisting of, at least in part, semiconductor material. A semiconductor structure may comprise either doped or undoped material.

Embodiments of the present invention comprise wire arrays or other semiconductor structures with control of the size, position, and uniformity of the fabricated wire arrays or structures over a relatively wide area. Such wire arrays or structures comprise crystalline Si wires of a length long enough to absorb sunlight fully, each wire with a radius matched to its diffusion length, and the wires being regularly spaced, and oriented predominantly vertically, preferably over large areas. Embodiments of the present invention may comprise growing the wire arrays or structures through VLS processes. As shown in FIGS. 1A-1I and described in additional detail below, a templating layer is first patterned with openings (e.g., an array of holes) in which the wires or structures are to be grown. The templating layer comprises a diffusion barrier for a deposited catalyst. The diffusion barrier may comprise a patterned oxide layer, a patterned insulating layer, such as a layer comprising silicon nitride, a patterned metal layer, or combinations of these materials or other materials or processes that facilitate the deposition of the catalyst for semiconductor structure growth. The catalyst is then deposited in the openings. Wires or structures are then grown on the substrate by heating the substrate and applying a growth gas.

Figure 1A:
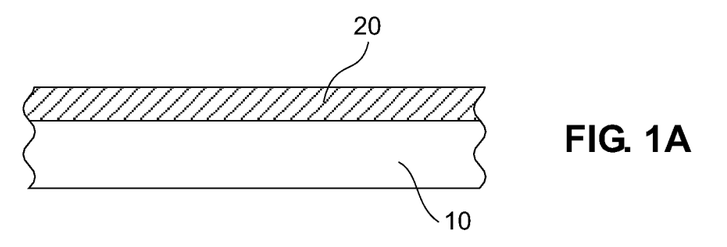
FIGS. 1A-1I show a method for fabricating wire arrays.

According to an embodiment of the present invention, a Si <111> wafer is used as the material from which the wire arrays are grown. Other materials may also be used to support wire growth, such as a thin Si layer disposed on glass, or other such Si substrates. All or portions of the wafer may be doped. For example, some embodiments may use a degenerately doped n-type Si wafer. As shown in FIG. 1A, a surface oxide layer 20 is thermally gown on the wafer 10. In one embodiment, the surface oxide layer is grown to a thickness of 285 nm. In another embodiment, the surface oxide layer 20 is grown to a thickness of 300 nm. Other embodiments may comprise oxide layers at other thicknesses. Still other embodiments have the oxide layer 20 deposited via chemical vapor deposition (CVD) or other methods known in the art.

Figure 1B:
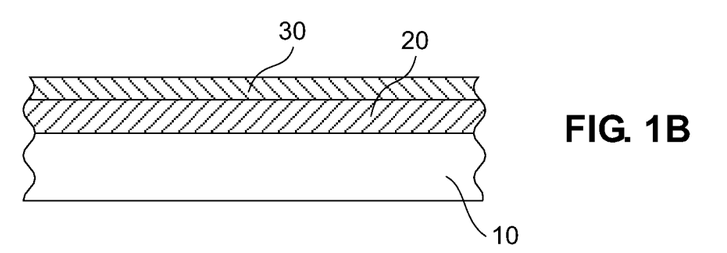
Figure 1C:
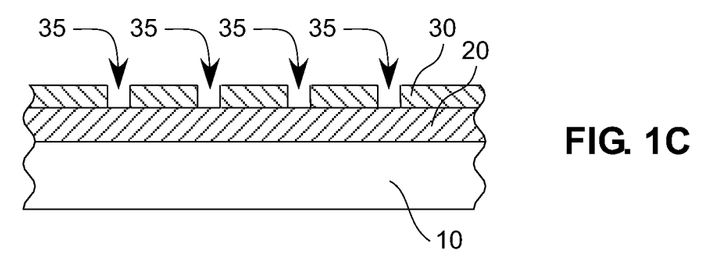
Figure 1D:
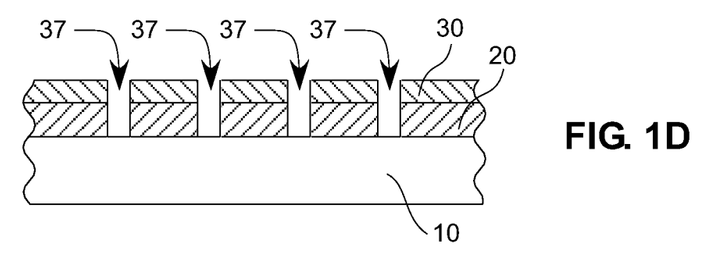

As shown in FIG. 1B, a photoresist layer 30 is applied. The photoresist layer is applied to support the development of a patterned template as discussed below. However, other materials and techniques for creating a patterned template may be used, such as a latex layer, or stamping or soft lithography. The photoresist layer may comprise S1813 photoresist from MicroChem Corp. (Newton, Mass., USA) or other photoresist material. The photoresist layer 30 is then exposed to a desired array pattern and developed with a developer to form a desired pattern of holes 35 in the resist layer 30 as shown in FIG. 1C. The developer may comprise MF-319 or other developers known in the art. The patterned resist layer 30 is then used to etch the oxide layer 20 on the Si wafer 10 as shown in FIG. 1D. Etching of the oxide layer may be achieved by using hydrofluoric acid compositions such as buffered HF (9% HF, 32% $NH_4F$) from Transene Company, Inc. (Danvers, Mass., USA). Other etching techniques known in the art may also be used to etch the oxide layer 20. The result of the etching will be a pattern of holes 37 in the oxide layer as shown in FIG. 1D. A preferred pattern of holes may be a square array of 3 µm diameter holes that are 7 µm center to center.

Figure 1E:
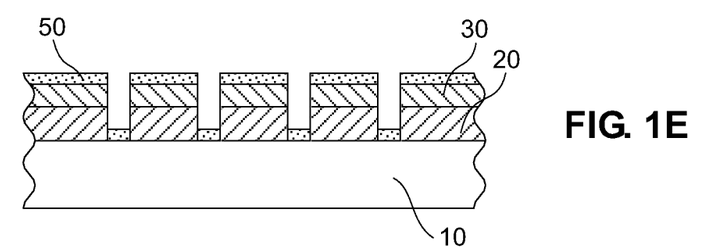
Figure 1F:
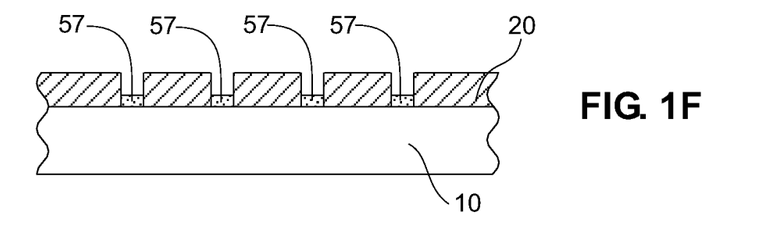

A growth catalyst 50 is then thermally evaporated onto the resist layer 30 and into the holes 37 in the oxide layer 20 as shown in FIG. 1E. Other methods of depositing the catalyst may be used, such as electrodeposition. Preferred catalysts comprise gold, copper, or nickel, but other metals known in the art as Si V-L-S catalysts may be used, such as platinum or aluminum. For example, 500 nm of gold may be thermally evaporated onto the resist layer 30 and into the holes 37. Lift-off of the photoresist layer 30 is then performed, leaving catalyst islands 57 separated by the oxide in the oxide layer 20 as shown in FIG. 1F.

Figure 1G:
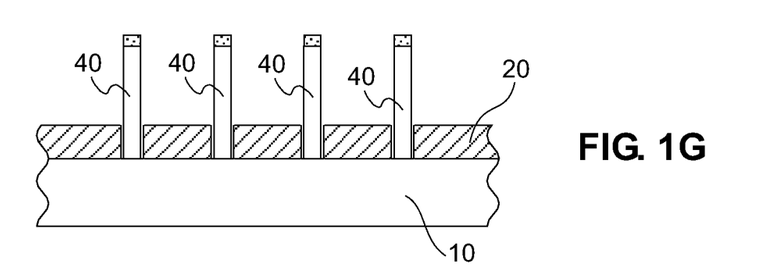

The wafer 10 with the patterned oxide layer 20 and the deposited catalyst may then be annealed. Preferably, the annealing is performed in a tube furnace at a temperature between 900 to 1000° C. or at a temperature of about 1050° C. for 20 minutes with the application of 1 atm of $H_2$ at a flow rate of 1000 sccm (where SCCM denotes cubic centimeters per minute at STP). Growth of wires on the wafer 10 is then performed. FIG. 1G shows the growth of wires 40 in a wire array through the application of a growth gas. Preferably, the wires 40 are grown in a mixture of $H_2$ (1000 sccm) and $SiCl_4$ (20 sccm) at about 1 atm. In one embodiment, the wires 40 may be grown for between 20 to 30 minutes at temperatures between 850° C. to 1100° C. Other embodiments may use different growth times, pressures, and or flow rates. However, optimal growth temperatures are between 1000° C. and 1050° C. Growth for these times and at these temperatures may produce wires from 10 µm to 30 µm in length or longer.

Figure 1H:
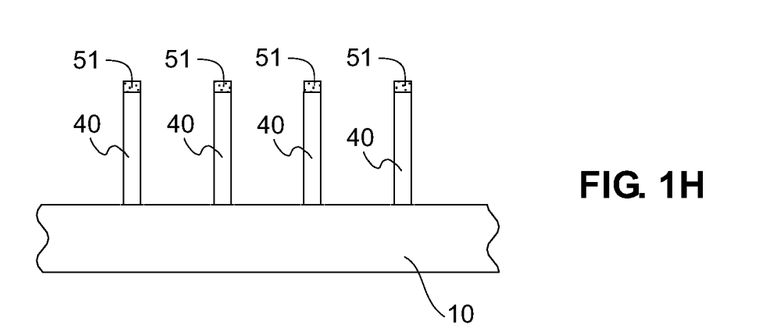
Figure 1I:
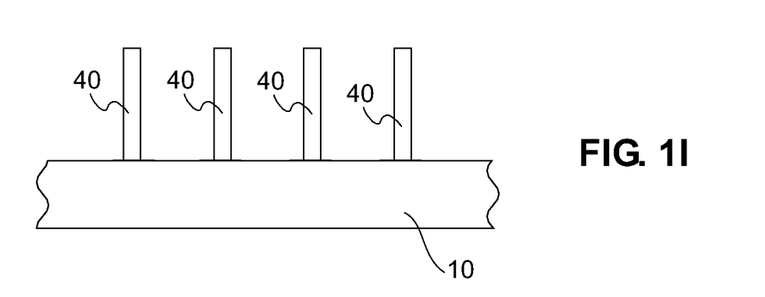

Following the growth of the wires 40, the oxide layer 20 may be removed, as shown in FIG. 1H. The oxide layer 20 may be removed by etching the wafer 10 for 10 seconds in 10% HF (aq) or other methods known in the art may be used to remove the oxide layer. As shown in FIG. 1H, catalyst particles 51 may remain at the top of each grown wire 40, which may impact the functionality of the resulting wire array. Therefore, it may be advantageous to remove the catalyst particles. For example, if the catalyst comprises Au, the gold particles may be removed by soaking the wafer 10 for 10 min in a TFA solution from Transene Company, Inc., which contains $I^-/I_3^-$. Other methods known in the art may also be used to remove catalyst particles. FIG. 1I shows the wires 40 with the catalyst particles 51 removed.

Figure 2A:
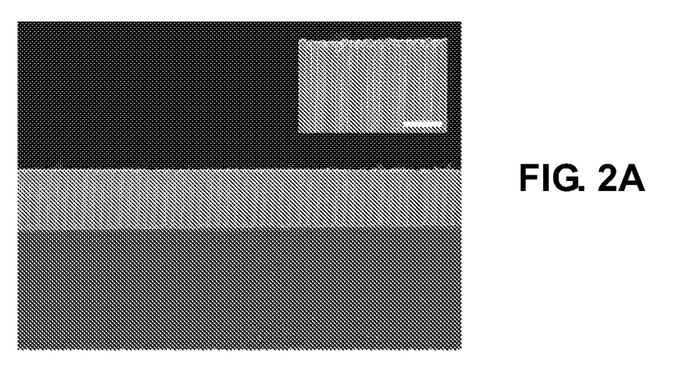
FIGS. 2A-2C show scanning electron microscopy view of an Au-catalyzed Si wire array.
Figure 2B:
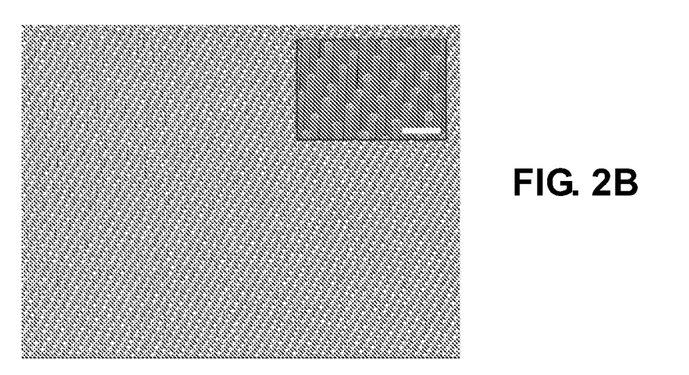
Figure 2C:
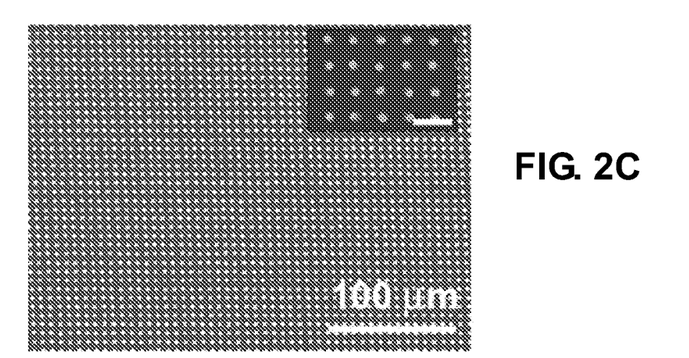

The method described above has been shown to produce nearly defect-free arrays that exhibited an extremely narrow diameter and length distribution, and highly controlled wire position. FIG. 2A shows an edge-on scanning electron microscopy (SEM) view of an Au-catalyzed Si wire array produced using the method described above. FIG. 2B shows a tilted view of the same array and FIG. 2C shows a top-down view. The 100 µm scale bar shown in FIG. 2C also applies to FIGS. 2A and 2B. FIGS. 2A-2C also contain an inset showing a magnified portion of the corresponding figure. The scale bar in each inset is 10 µm. As shown in FIGS. 2A-2C, the wire growth was very uniform over areas >1 $cm^2$. The growth uniformity typically declined within several hundred microns of the edges of the wafer (not shown in FIGS. 2A-2C), most likely due to differences in temperature and/or gas flow at such locations.

Figure 3:
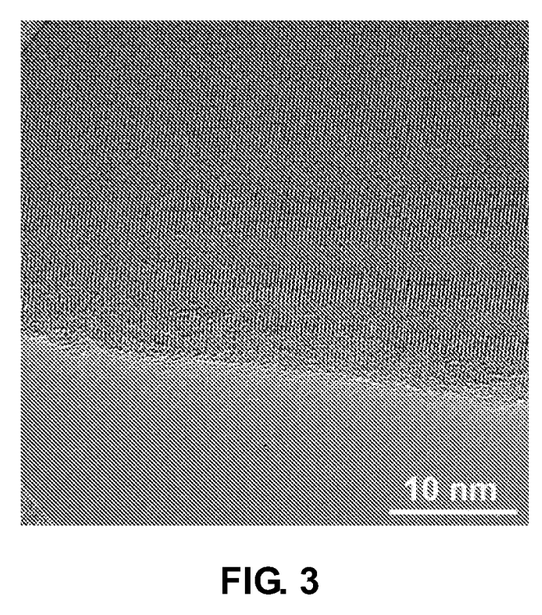
FIG. 3 shows a transmission electron microscopy picture of an Au-catalyzed Si wire.

FIG. 3 shows a transmission electron microscopy picture of an Au-catalyzed Si wire that indicates that wires generated according to the method described above are single crystalline and grow along the <111> direction. The vertical lines in FIG. 3 are lattice fringes, and the horizontal bands are due to the curved surface of the wire causing interference fringes. No crystal defects were observed by TEM in the wires. From the image of FIG. 3, a lattice spacing of 0.307±0.004 nm can be inferred, consistent with growth in the <111> direction. This lattice spacing, combined with the fact that the wires grew as single crystals normal to a Si(111) wafer, is consistent with the growth being in the <111> direction (the Si (111) lattice parameter is ~0.314 nm).

Figure 4:
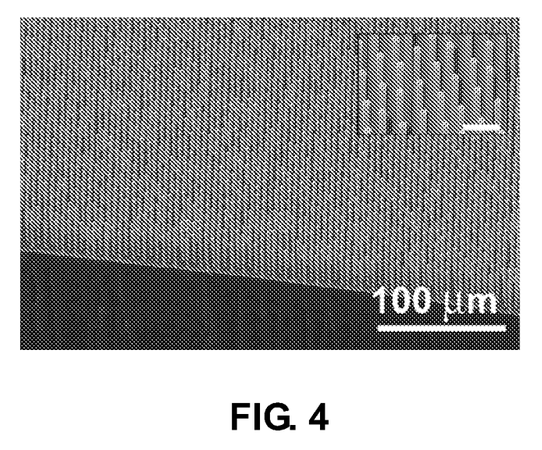
FIG. 4 shows a tilted SEM view of a Cu-catalyzed Si wire array.
Figure 5:
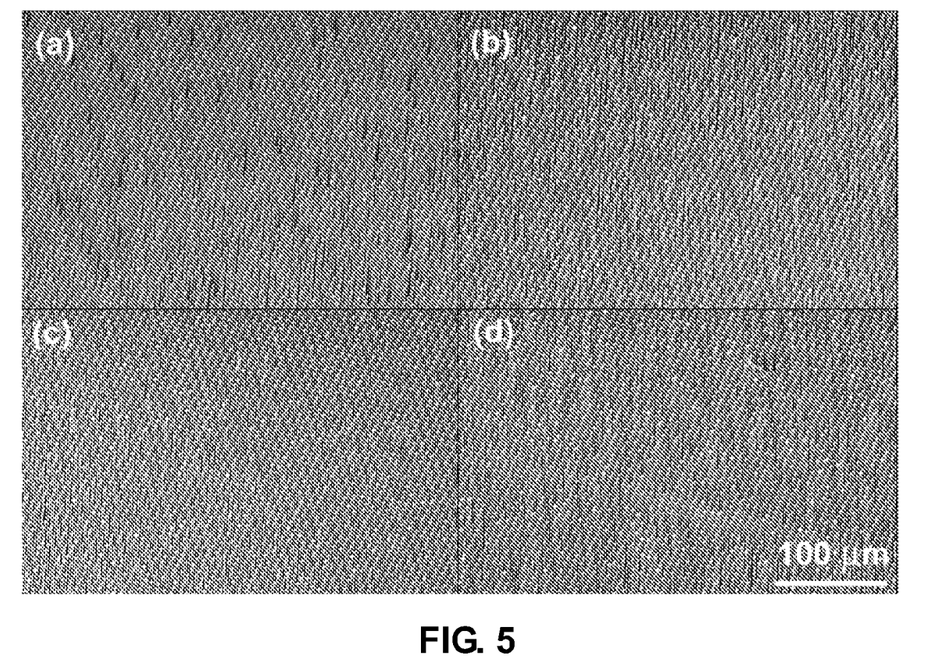
FIG. 5 shows representative tilted SEM images of regions near each of the four corners of a Cu-catalyzed Si wire array.

As discussed above, other catalysts may be used to facilitate the growth of the Si wires in the wire array. Nominally identical wire arrays may be obtained when Cu, Ni, Pt, or Al (or other Si catalyst metals) are used as the VLS catalyst instead of Au. FIG. 4 shows a tilted SEM view of a Cu-catalyzed Si wire array produced using the method described above where the array has nearly 100% fidelity over a large >1 $cm^2$ area. The scale bar in the inset in FIG. 4 is 10 µm. FIG. 5 shows representative tilted SEM images of regions near each of the four corners of a 0.5×1 cm sample grown at 1000° C. with Cu catalyst, illustrating the uniformity over large areas. The scale bar in FIG. 5 applies to all panels.

Figure 6:
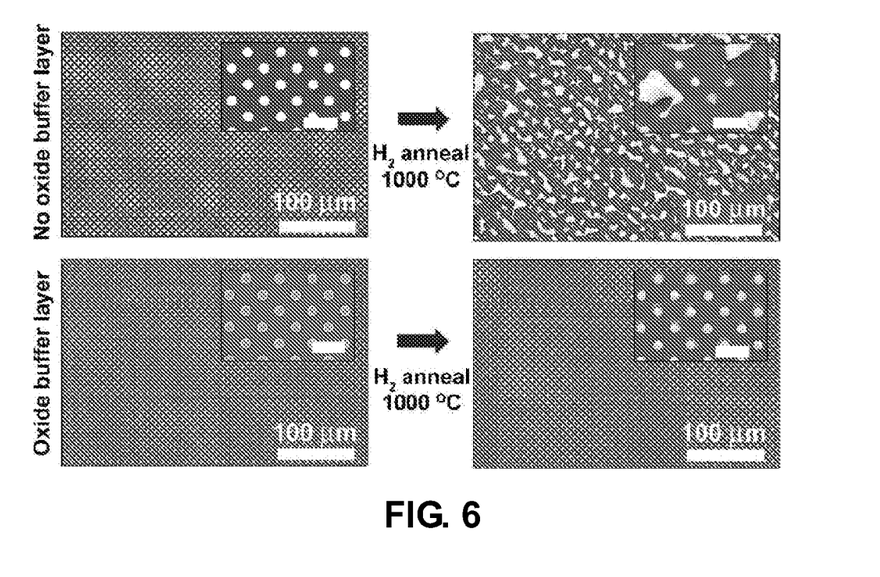
FIG. 6 shows the effect of a high temperature anneal on Au arrays with and without a 300 nm oxide buffer layer.

Use of the oxide layer 20 is particularly important to some embodiments of the present invention. Attempts to grow Si wire arrays did not yield high pattern fidelity when the catalyst was not confined using the patterned oxide layer as described above. Wires were grown by photolithographically patterning photoresist on a clean Si<111> wafer, then exposing it for 5 s to buffered HF (aqueous), followed by evaporation of 500 nm of Au and lift-off of the resist. This was used to produce a square array of 3 µm diameter Au islands with a center-to-center pitch of 7 µm. Samples were then annealed in a tube furnace at 900-1000° C. for 20 min under 1 atm of $H_2$ at a flow rate of 1000 SCCM, followed by wire growth under 1 atm of $H_2$ and $SiCl_4$, at flow rates of 1000 and 20 SCCM, respectively. This produced arrays of low fidelity, with no control over the wire diameter or wire position. Examination of the samples after a 20 min $H_2$ anneal only revealed that this behavior was due to substantial agglomeration of the catalyst. FIG. 6 shows the effect of a 20 min anneal in $H_2$, at 1000° C. and atmospheric pressure, on Au arrays with and without a 300 nm oxide buffer layer, demonstrating the importance of the buffer oxide in maintaining the pattern fidelity. The scale bars in the insets are 10 µm.

The growth of Si nanowires at 800-900° C. with $SiCl_4/H_2$ has been described in A. I. Hochbaum, R. Fan, R. He, and P. Yang, Nano Lett. 5, 457 (2005) and I. Lombardi, A. I. Hochbaum, P. Yang, C. Carraro, and R. Maboudian, Chem. Mater. 18, 988 (2006). In embodiments of the present invention, the thickness of catalyst is proportional to the diameter of the wires being grown, so 500 nm of catalyst material produced ~1.5 µm diameter Si wires. This relatively thick catalyst layer, and/or the higher growth temperatures, led to a significant problem with catalyst migration if a buffer oxide was not present on the surface, in contrast to the Hochbaum and Lombardi references in which much thinner catalyst layers were used.

Figure 7A:
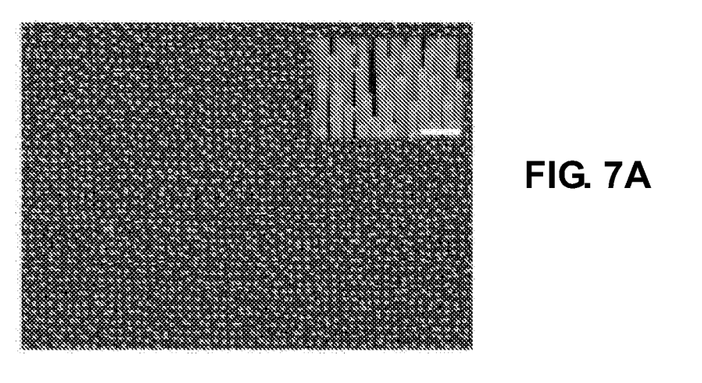
FIGS. 7A and 7B show top-down and tilted SEM views of Au-catalyzed Si wire growth at higher temperatures.
Figure 7B:
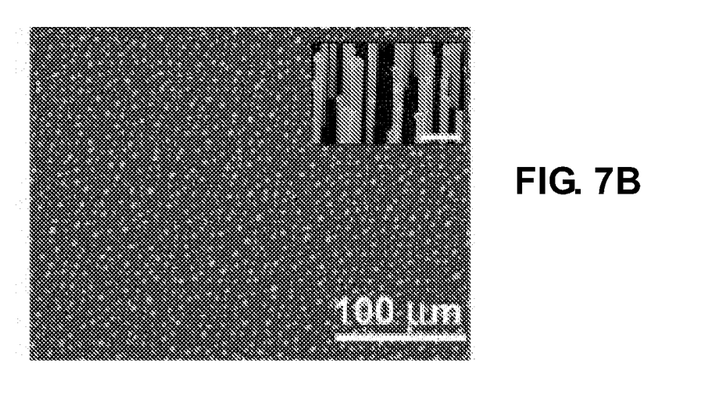

The growth of Si microwires according to embodiments of the present invention have optimal growth temperatures of 1000-1050° C. At 950° C. and below, the wires either did not grow straight, grew intermittently straight with kinks, or grew straight but not aligned normal to the substrate. At 1075° C. and above, the wires grew straight and normal to the substrate, but significant destruction of the surface oxide was observed during the growth process, leading to a loss of the pattern fidelity. See, for example, FIGS. 7A and 7B. FIG. 7A shows a top-down and (inset) tilted SEM views of the Au-catalyzed Si wire growth at 1075° C. FIG. 7B shows a top-down and (inset) titled SEM view of Au-catalyzed Si wire growth at 1100° C. The 100 μm scale bar applies to both FIGS. 7A and 7B, and the scale bars in the insets are 10 μm. Both FIGS. 7A and 7B show showing the breakdown in pattern fidelity due to the destruction of surface oxide.

Figure 8:
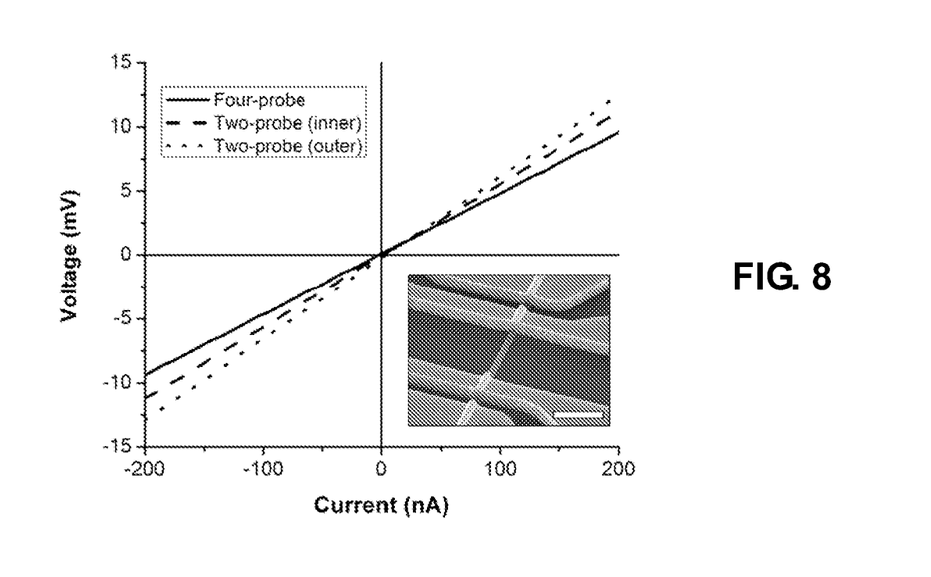
FIG. 8 shows an I-V measurement for an individually contacted nanowire using a four-point probe technique.

To characterize the electrical properties of the Si wires produced according to an embodiment of the present invention, four-point probe and field-effect measurements were performed on individual wires in the arrays. For these measurements, the as-grown wires were removed from the growth substrate by sonication in isopropanol and were then deposited on a degenerately doped silicon wafer that had been coated with 100 nm of $Si_3N_4$. The four-probe electrodes were fabricated using photolithography, followed by evaporation of 300 nm of Al and 900 nm of Ag, and finally by lift-off of the resist. Annealed Al was observed to make suitable ohmic contacts to the wires. Back-gated measurements indicated that the as-grown wires were n type, with a resistivity of 0.1-0.6 Ωcm, corresponding to dopant densities of $8 \times 10^{15}$-$5 \times 10^{16}$ cm$^{-3}$, assuming that the carrier mobility in these wires is the same as that in bulk Si. FIG. 8 shows an I-V measurement for an individually contacted nanowire using the four-point probe technique. The wire resistance for this sample was 50 kΩ, corresponding to a doping level of $2.9 \times 10^{16}$ cm$^{-3}$. The inset in FIG. 8 is a SEM image of the four-probe measurement device, viewed at 45°. The scale bar is 6 μm.

A particular application for wire arrays fabricated according to embodiments of the present invention is for the use of such wire arrays in photo cells. Device analysis has shown that photovoltaic efficiency is maximized in wire arrays when the mean radius of the wires is comparable to the minority carrier diffusion length. This is because of a trade-off between increased current collection and the loss of open-circuit voltage due to the increased junction and surface area. Diffusion of gold into bulk silicon at the growth temperatures of 1000-1050° C. leads to carrier lifetimes of >1 ns, which combined with carrier mobilities expected for the observed dopant densities, indicates minority carrier diffusion lengths of ≧1 μm. However, as described above, embodiments of the present invention provide the ability to grow relatively long wire arrays (greater than 30 μm) while maintaining a radius comparable to the minority diffusion length (on the order of 1.5 μm). Hence, embodiments of the present invention provide wire arrays with aspect ratios particularly suitable for use in solar cell apparatus. Further, embodiments of the present invention provide for the ability to have relatively dense arrays of wires, further improving the ability of devices using such arrays to convert light to electrical energy.

According to an embodiments of the present invention, photolithography is a suitable method for enabling uniform arrays of wires of diameters of ≧1 μm to be grown over large areas. In cost sensitive applications such as photovoltaics, it may be desirable to employ lower-cost lithographic methods, and embodiments of the present invention are readily extendable to alternative patterning techniques such as nanoimprint lithography.

Cost also motivates the use of non-Au catalysts for embodiments according to the present invention. As indicated above, Cu, Ni, Pt, or Al may be used as a catalyst for Si wire growth. Cu is, unlike Au, an inexpensive, earth-abundant material, and, therefore, of particular interest for such embodiments. Although Cu is more soluble in Si than Au and is also a deep trap, Si solar cells may be more tolerant of Cu contamination than of Au, and thus diffusion lengths of at least microns even in the case of Cu catalyzed growth can be expected.

As discussed above, embodiments of the present invention may be used for the fabrication of photovoltaic or photoelectrochemical cells. Other embodiments of the present invention may provide for the fabrication of wire arrays for photonic crystals or other devices or structures. Also, methods according to embodiments of the present invention techniques may provide for making wire arrays of materials that cannot currently be fabricated with top-down methods. Embodiments of the present invention may also provide for the fabrication of wire arrays or other structures for batteries, solar cells, 3-D circuits, capacitors, or other devices and apparatus where the highly regular vertically ordered and oriented nature of wire arrays and other structures provided by these embodiments are desired.

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . ."

What is claimed is:

1. A method for fabricating vertically aligned Si wire arrays comprising:
    forming a templating layer on a Si substrate, wherein the templating layer comprises an oxide;
    patterning the templating layer with a plurality of holes extending to the Si substrate;
    depositing a catalyst into one or more of the holes in the templating layer; and
    growing wires on the substrate at a temperature between 950° C. to 1100° C. and applying a growth gas comprising $SiCl_4$.

2. The method according to claim 1, wherein the temperature during the wire growth is between about 1000° C. about 1050° C.

3. The method according to claim 1, wherein the templating layer has a thickness between about 285 nm to about 300 nm.

4. The method according to claim 1, wherein the patterning of the templating layer with a plurality of holes comprises: applying a photoresist layer to the oxide layer; patterning the photoresist layer with a desired pattern of holes; and etching the oxide layer based on the desired pattern of holes in the photoresist layer to form the plurality of holes in the oxide layer.

5. The method according to claim 4, wherein depositing a catalyst into the holes in the oxide layer comprises: thermally evaporating the catalyst onto the photoresist layer and into the holes in the oxide layer; and lifting-off the photoresist layer.

6. The method according to claim 1, wherein depositing a catalyst comprises depositing a catalyst layer with a thickness to grow wires with lengths and diameters selected for light to electricity conversion.

7. The method according to claim 1, wherein the templating layer is patterned with a square array of holes that are about 3 μm in diameter and are spaced apart by about 7 μm center to center.

8. The method according to claim 1, wherein forming a templating layer comprises thermally growing an oxide layer on the Si substrate.

9. The method according to claim 1 wherein the catalyst comprises gold, copper, or nickel.

10. A method for fabricating semiconductor structures comprising: forming a templating layer, wherein the templating layer comprises an oxide, on a Si substrate; patterning the templating layer with an array of holes extending to the Si substrate; forming catalyst islands within one or more holes in the array of holes; and growing semiconductor structures on the Si substrate at a temperature between about 950° C. to about 1050° C. and applying a growth gas comprising $SiCl_4$.

11. The method according to claim 10, wherein the oxide layer has a thickness between about 285 nm to about 300 nm.

12. The method according to claim 10, wherein the catalyst islands comprise gold, copper, or nickel.

13. The method according to claim 10, wherein templating layer is patterned with holes to produce wire arrays, wherein wires in the wire arrays have diameters of about 1.5 μm and the catalyst islands comprise catalyst having a height of approximately 500 nm.

14. The method according to claim 10, further comprising removing the templating layer after the semiconductor structures are grown and removing residual catalyst left at the top of one or more of the semiconductor structures.

* * * * *